United States Patent
Klemp et al.

(10) Patent No.: US 10,147,647 B2
(45) Date of Patent: Dec. 4, 2018

(54) METHOD OF REMOVING A GROWTH SUBSTRATE FROM A LAYER SEQUENCE

(71) Applicant: OSRAM Opto Semiconductors GmbH, Regensburg (DE)

(72) Inventors: Christoph Klemp, Regensburg (DE); Marco Englhard, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/558,743

(22) PCT Filed: Mar. 14, 2016

(86) PCT No.: PCT/EP2016/055454
§ 371 (c)(1),
(2) Date: Sep. 15, 2017

(87) PCT Pub. No.: WO2016/146584
PCT Pub. Date: Sep. 22, 2016

(65) Prior Publication Data
US 2018/0082899 A1 Mar. 22, 2018

(30) Foreign Application Priority Data

Mar. 19, 2015 (DE) .......................... 10 2015 104 147

(51) Int. Cl.
*H01L 21/78* (2006.01)
*H01L 21/306* (2006.01)
(Continued)

(52) U.S. Cl.
CPC .... *H01L 21/7813* (2013.01); *H01L 21/30625* (2013.01); *H01L 21/67086* (2013.01);
(Continued)

(58) Field of Classification Search
CPC .................................................. H01L 21/7813
(Continued)

(56) References Cited

U.S. PATENT DOCUMENTS

| 6,124,214 A | 9/2000 | Hembree et al. |
| 2004/0129384 A1 | 7/2004 | Tomari |

(Continued)

FOREIGN PATENT DOCUMENTS

| DE | 197 34 635 A1 | 2/1999 |
| DE | 10 2005 004 795 A1 | 8/2006 |
| WO | 2016/066645 A2 | 5/2016 |

*Primary Examiner* — Roberts P Culbert
(74) *Attorney, Agent, or Firm* — DLA Piper LLP (US)

(57) ABSTRACT

A method of detaching a growth substrate from a layer sequence includes introducing at least one wafer composite into an etching bath containing an etching solution such that the etching solution is located at least in regions within separating trenches, repeatedly varying a pressure of a base pressure prevailing in the etching bath with at least one pressure variation device, and detaching the growth substrate, wherein at least one of 1-3 is satisfied: 1) a buffer chamber attached to the etching bath and connected thereto is provided and the volume variation is effected by a movement of a piston or hydraulic plunger introduced into the buffer chamber, 2) the volume variation is at least partly effected with a compressor attached to the etching bath, and 3) the pressure variation is at least partly effected by at least one of removal of a gas and a liquid from the etching bath or by addition of at least one of the gas and the liquid thereto.

9 Claims, 4 Drawing Sheets

(51) Int. Cl.
 *H01L 21/67* (2006.01)
 *H01L 21/683* (2006.01)
 *H01L 31/18* (2006.01)
 *H01L 33/00* (2010.01)

(52) U.S. Cl.
 CPC .... *H01L 21/67092* (2013.01); *H01L 21/6835* (2013.01); *H01L 21/7806* (2013.01); *H01L 31/1892* (2013.01); *H01L 33/0079* (2013.01); *H01L 2221/68381* (2013.01)

(58) Field of Classification Search
 USPC ............................................. 438/692
 See application file for complete search history.

(56) References Cited

U.S. PATENT DOCUMENTS

| | | |
|---|---|---|
| 2009/0280588 A1 | 11/2009 | Mathew et al. |
| 2011/0143467 A1 | 6/2011 | Xiong et al. |
| 2012/0273815 A1 | 11/2012 | Tsai et al. |
| 2013/0320386 A1 | 12/2013 | Schubert et al. |
| 2014/0087541 A1 | 3/2014 | Werner et al. |
| 2014/0203408 A1 | 7/2014 | Takada et al. |

METHOD OF REMOVING A GROWTH SUBSTRATE FROM A LAYER SEQUENCE

TECHNICAL FIELD

This disclosure relates to a method of removing a growth substrate from a layer sequence.

BACKGROUND

DE 19734635 A1 describes a method of detaching a growth substrate. There is a need to provide a simplified method of detaching a growth substrate, especially non-destructively, from a layer sequence.

SUMMARY

We provide a method of detaching a growth substrate from a layer sequence including A) providing at least one wafer composite including the growth substrate, the layer sequence applied to the growth substrate, and a carrier attached to a top surface of the layer sequence remote from the growth substrate, wherein the layer sequence is patterned in a multiplicity of regions spaced apart in lateral directions and separated from one another by a multiplicity of separating trenches, and the separating trenches connect to one another, B) introducing the at least one wafer composite into an etching bath containing an etching solution such that the etching solution is located at least in regions within the separating trenches, C) repeatedly varying a pressure of a base pressure prevailing in the etching bath with at least one pressure variation device, and D) detaching the growth substrate, wherein at least one of A)-C) is satisfied: 1) prior to B) a buffer chamber attached to the etching bath and connected thereto is provided and the volume variation is effected by a movement of a piston or hydraulic plunger introduced into the buffer chamber, 2) the volume variation is at least partly effected with a compressor attached to the etching bath, and 3) the pressure variation is at least partly effected by at least one of removal of a gas and a liquid from the etching bath or by addition of at least one of the gas and the liquid thereto, the removal is effected with a first vacuum pump connected to the etching bath and the addition is effected with a gas inlet connected to the etching bath.

We also provide a method of detaching a growth substrate from a layer sequence including A) providing at least one wafer composite including the growth substrate, the layer sequence applied to the growth substrate, and a carrier attached to a top surface of the layer sequence remote from the growth substrate, wherein the layer sequence is patterned in a multiplicity of regions spaced apart in lateral directions and separated from one another by a multiplicity of separating trenches, and the separating trenches connect to one another, B) introducing the at least one wafer composite into an etching bath containing an etching solution such that the etching solution is located at least in regions within the separating trenches, C) repeatedly varying the pressure of a base pressure prevailing in the etching bath using at least one pressure variation device, and D) detaching the growth substrate.

LIST OF REFERENCE NUMERALS 1 wafer composite
1d outer edge
10 growth substrate
11 layer sequence
11a top surface
111 sacrificial layer
112 semiconductor layer stack
13 carrier
14 separating trenches
15 regions
2, 2' enlarged view
20 gas bubbles
21 direction of movement
22 convection
3 vacuum system
30 pressure change controller
301 control connections
31 first vacuum pump
32 pump unit
33 second vacuum pump
34 vacuum reservoir
351 compressor
352 gas inlet
36 chemical reservoir
37 Woulf's flask
38 pressure gauge
39 valve
310 vacuum connection
311 chemical feed inlet
312 vacuum line
313 chemical outlet
314 overpressure line
315 DI water feed inlet
317 water spray nozzle
321 discharge outlet
322 outflow
323 inflow
40 etching bath
40a top side of the etching bath
401 screw clip
402 seal
403 screw seal
41 ultrasonic bath
42 ultrasonic radiation
43 heater
44 etching solution
45 gas
47 wafer holder
50 buffer chamber
51 hydraulic plunger/piston
52 pivot joint
53 pivot arm

DETAILED DESCRIPTION

We provide a method of detaching a growth substrate. The method is especially suitable for separating a growth substrate from a layer sequence applied to the growth substrate.

At least one wafer composite may be provided. The wafer composite has a main extension plane in which it extends in lateral directions. Perpendicularly to the main extension plane, in a vertical direction, the wafer composite has a thickness that is small compared to the maximum extent of the wafer composite in the lateral directions.

The wafer composite comprises a growth substrate and a layer sequence applied to, especially grown at least partly epitaxially on, the growth substrate. The layer sequence can comprise a semiconductor layer stack having a multiplicity of semiconductor layers. In particular, the layer sequence can have at least one active layer for absorption and/or emission of light, or an integrated circuit. For example, the layer sequence is intended for use in a light-emitting diode chip, a photodiode chip and/or a solar cell chip. The layer sequence can further comprise a sacrificial layer, by which the semiconductor layer stack can be joined to the growth substrate.

The sacrificial layer can be selectively etchable to the semiconductor layer stack and/or the growth substrate. In other words, there is at least one etching solution having a substantially higher etching rate in respect of the material of the sacrificial layer than in respect of the material of the semiconductor layer stack and/or the growth substrate. The sacrificial layer can have a high aluminum content. In particular, the sacrificial layer can be formed, for example, with $Al_nGa_{1-n}As$, where $0.6 \leq n \leq 1$, preferably $0.7 \leq n \leq 1$.

The wafer composite further comprises a carrier attached to a top surface of the layer sequence remote from the growth substrate. For example, the carrier is mechanically joined to the layer sequence by a solder layer that can directly adjoin the top surface and the carrier. The carrier can be formed, for example, with a ceramic material, a plastics material, a metal and/or a semiconductor material. The carrier can be, for example, an electrical connection carrier.

The layer sequence may be patterned in a multiplicity of regions spaced apart in lateral directions and separated from one another by a multiplicity of separating trenches. The separating trenches can be recesses in the layer sequence. The separating trenches have a width given by the minimum extent of the separating trenches in at least one lateral direction. For example, the width is at least 1 μm and at most 1000 μm, preferably at least 2 μm and at most 200 μm and especially preferably at least 5 μm and at most 100 μm. Along the vertical direction the separating trenches have a height corresponding, for example, to the maximum extent of the layer sequence in the vertical direction. The height and/or the width of the separating trenches can in particular be the feature sizes thereof.

The separating trenches laterally connect to one another. In other words, the separating trenches are intercommunicating. In particular, the separating trenches connect to one another such that, from a center of the wafer composite along the separating trenches to an outer edge of the wafer composite, the separating trenches have a minimum cross-section of at least 1 $\mu m^2$, preferably at least 1000 $mm^2$, preferably at least 4 $\mu m^2$ and at most 40 $mm^2$ and especially preferably at least 10 $\mu m^2$ and at most 1 $mm^2$. The cross-section is in particular given by the feature sizes of the separating trenches.

For example, the separating trenches surround the regions of the layer sequence in a frame-like manner. In particular, the regions of the layer sequence created by the separating trenches correspond to the chips to be produced, for example, the light-emitting diode chips, photodiode chips and/or solar cell chips to be produced.

The at least one wafer composite may be introduced into an etching bath containing an etching solution. The etching bath can especially be a reaction chamber at least partly filled with the etching solution. The etching bath can additionally contain a gas such as, for example, air. In particular, some or all of the gas can be in the form of gas bubbles located within the etching solution. A total volume of the etching bath can then be given by the sum of a liquid volume of the etching solution and a gas volume of the gas. In a borderline case, the etching bath can be completely full of the etching solution at the beginning of the process, the total volume at the beginning of the process then being given by the liquid volume. In that borderline case, it is still possible for gas bubbles to be formed within the etching solution during the etching process, with the result that a gas volume is generated.

The etching solution can be acid such as, for example, 10% hydrofluoric acid. In particular, the etching solution can be suitable for selective etching of the sacrificial layer of the layer sequence. A direct contact between the etching solution and the sacrificial layer can accordingly result in a chemical reaction in which the sacrificial layer reacts with the etching solution. In particular, the sacrificial layer is thereby dissolved or detached from the layer sequence and/or the growth substrate. Furthermore, reaction gases and/or reaction products can be formed. A "selective etching" of the sacrificial layer takes place, for example, when the etching solution has an etching rate in respect of the material of the sacrificial layer that is at least a factor 10, preferably a factor 100 and especially preferably a factor 1000, above the etching rate in respect of the material of the layer sequence, of the growth substrate and/or of the carrier.

Introduction of the wafer composite into the etching bath is effected such that the wafer composite is covered at least in regions by the etching solution. Furthermore, the etching solution is located at least in regions within the separating trenches. In particular, the etching solution can in regions be in direct contact with the layer sequence, especially the sacrificial layer. For example, the etching solution is introduced into the separating trenches by exploiting the capillary effect. In that case, it is possible for the etching solution to be sucked into the separating trenches as into a thin tube.

For example, the at least one wafer composite can first be introduced into the etching bath which has not yet been filled with the etching solution. The etching solution at a suitable temperature is then introduced or sucked into the etching bath.

The pressure of a base pressure prevailing in the etching bath may be repeatedly varied. The base pressure can especially be the average pressure prevailing in the etching bath. For example, the base pressure is at least 0.01 bar and at most 70 bar, preferably at least 0.1 bar and at most 30 bar and especially preferably at least 0.5 bar and at most 5 bar.

The pressure variation is effected using at least one pressure variation device. The pressure variation device can in particular be a pump apparatus such as, for example, a vacuum pump, and/or a volume variation device such as, for example, a compressor, a gas inlet and/or a volume reservoir such as, for example, a vacuum reservoir. In particular, the pressure variation device can comprise a plurality of components with which the pressure within the etching bath can be varied.

In the method of detaching a growth substrate from a layer sequence, the method may comprise the following steps:

A) providing at least one wafer composite comprising the growth substrate, the layer sequence applied to the growth substrate, and a carrier attached to a top surface of the layer sequence remote from the growth substrate, wherein the layer sequence is patterned in a multiplicity of regions spaced apart in lateral directions and separated from one another by a multiplicity of separating trenches, and the separating trenches laterally connect to one another, B) introducing the at least one wafer composite into an etching bath containing an etching solution such that the etching solution is located at least in regions within the separating trenches, C) repeatedly varying the pressure of a base pressure prevailing in the etching bath using at least one pressure variation device, and D) detaching the growth substrate.

The method steps can especially be carried out in the order indicated.

At least the etching solution located within the separating trenches may have the gas bubbles. The gas bubbles can be small bubbles formed as a result of the reaction of the sacrificial layer with the etching solution. In other words, the gas bubbles can be reaction products of the etching process. By the pressure variation within the etching bath the volume of the gas bubbles in the separating trenches is deliberately altered. In particular, at low pressure the gas bubbles are large and at high pressure small compared to the feature sizes of the separating trenches. The pressure variation accordingly generates a constant pulsing of expansion and compression of the gas bubbles in the solution. That alteration in the volume of the gas bubbles then forces a convection of the etching solution within the separating trenches.

Our method especially pursues the idea of increasing the throughflow speed of the etching solution through the separating trenches by varying the pressure within the etching bath. Since the etching solution can be a non-compressible liquid, it is possible in particular to vary the pressure of the gas or the gas bubbles in the etching bath. Without the use of the pressure variation during the detachment of a growth substrate from a layer sequence, the mass transport of the reaction products or reactants in the separating trenches is insufficient. Accordingly, the convection in the separating trenches must be forced, it being necessary also to overcome the interfacial energies as a result of the gas bubbles. The increased throughflow speed enables the detachment speed to be increased. Using the method described herein it is accordingly possible to accelerate wet-chemical processes which are transport-limited by small feature sizes and possible generation of gas.

In particular, as a result of the pressure variation the volume of the gas bubbles located in the etching solution within the separating trenches can be altered and accordingly the throughflow through the separating trenches can be increased. Even gas bubbles which in the case of small feature sizes are confined by capillary forces are mobilized by the pressure variation so that the transport of the etching solution is then no longer impeded, but is controlled by such forced convection. Furthermore, in the course of the pressure variation the gas bubbles confined in the separating trenches rise as a result of the superposed hydrostatic pressure and can thus leave the separating trenches.

The pressure variation may comprise a change between a maximum pressure and a minimum pressure. In particular, a temporal change between the maximum pressure and the minimum pressure takes place. Preferably, a repeated temporally periodic change between the minimum pressure and the maximum pressure takes place. The minimum pressure can be the saturated vapor pressure of the etching solution.

The maximum pressure may correspond to at least 1.5 times, preferably at least 2 times and especially preferably at least 10 times, the base pressure. Furthermore, the minimum pressure corresponds to at most 0.5 times, preferably at most 0.2 times and especially preferably at most 0.1 times, the base pressure. For example, the base pressure is 1 bar. For example, the minimum pressure and the maximum pressure can then be 0.2 bar and 2 bar, respectively.

The pressure variation may take place temporally periodically at a variation frequency of at least 0.01 Hz, preferably at least 0.1 Hz and especially preferably at least 0.5 Hz, and at most 15 kHz, preferably at most 10 kHz and especially preferably at most 500 Hz. For example, a change between the maximum pressure and the minimum pressure can take place at the variation frequency. In particular, the variation frequency is matched to the low flow speed of the etching solution within the separating trenches. Alternatively or in addition, the variation frequency can be matched to the mobility of the etching solution in the separating trenches.

The pressure variation may include a volume variation between a minimum volume and a maximum volume around a base volume of the etching bath. In other words, the volume of the etching bath, especially the gas volume of the etching bath, is increased and reduced, preferably temporally periodically to thus generate a pressure variation within the etching bath. The base volume can be the gas volume of the etching bath before the volume variation was begun. The volume variation can in particular be carried out using the volume variation device.

The maximum volume may correspond to at least 5 times, preferably at least 10 times and especially preferably at least 40 times, the base volume and/or the minimum volume corresponds to at most 0.8 times, preferably at most 0.5 times and especially preferably at most 0.3 times, the base volume.

Prior to step B) a buffer chamber may be provided and attached to the etching bath and provided connected thereto. For example, the buffer chamber is a vacuum chamber and/or an overpressure chamber. The buffer chamber can connect to the etching bath directly or by vacuum lines. The buffer chamber can especially be cylindrical and have a swept volume. The minimum volume then corresponds to the net volume of the etching bath and the connecting vacuum line, while the maximum volume corresponds to the volume of the etching bath inclusive of the available swept volume. The volume variation that can be generated, that is to say the difference between the minimum volume and the maximum volume that can be generated, increases with the ratio of the swept volume to the volume of the etching bath and the vacuum lines. In particular, a ratio of the maximum volume to the minimum volume can be, for example, 10:1.

The volume variation may be effected by a movement of a piston introduced into the buffer chamber or of a hydraulic plunger introduced into the buffer chamber. In particular, the swept volume can be added to or removed from the volume of the etching bath by the piston or the hydraulic plunger. Accordingly, by a periodic movement of the piston or hydraulic plunger, for example, using a crankshaft, a change in pressure is generated at a crankshaft frequency which can be the variation frequency. In particular, the crankshaft frequency can be at least 0.01 Hz, preferably at least 0.1 Hz and especially preferably at least 1 Hz, and at most 15 kHz, preferably at most 10 kHz and especially preferably at most 500 Hz. For example, the crankshaft frequency can lie at least in the infrasonic range.

The buffer chamber may have at least one variation valve. The volume variation is effected by closing and/or opening the variation valve. The variation valve can be provided in addition to or as an alternative to the piston or hydraulic plunger. The variation valve can be actuated individually, for example, with a piezo. As a result, it is possible to adjust as desired an additional overpressure or underpressure, or the minimum pressure or maximum pressure, in the etching bath. By the use of the variation valve it is possible to achieve high variation frequencies and high volume variations.

The volume variation may be at least partly effected with a compressor attached to the etching bath. Using the compressor, the volume can be reduced, for example, to a minimum volume in a simplified manner.

The pressure variation may be at least partly effected by removal of gas and/or liquid from the etching bath or by addition of gas and/or liquid thereto. The pressure variation is then generated by a variation of the amount of gas or amount of liquid in the etching bath.

The removal of gas and/or liquid may be effected with a first vacuum pump connected to the etching bath. Furthermore, the addition of gas and/or liquid may be effected with a gas inlet or liquid inlet connected to the etching bath. In particular, by the gas inlet it is possible to introduce nitrogen gas into the system.

The first vacuum pump can additionally have a ventilation valve through which reaction gas formed during the etching process can be discharged. As a result, a pressure variation can effectively be generated within the etching bath. A further advantage of using the first vacuum pump is that the minimum pressure within the etching bath achievable with a vacuum pump is lower than the saturated vapor pressure of the etching solution. As a result, the minimum pressure achievable is limited so that the etching solution can be brought to a boil without increasing the process temperature. This enables additional gas bubbles to be generated within the separating trenches. In a detachment without intrinsic development of gas bubbles, it is in this way possible to generate gas bubbles to increase convection.

Especially strong and rapid pressure variations can be generated if, in addition to the reaction products, little or no additional gas volume is present in the etching bath. This can be achieved, for example, by additionally pumping away the reaction products with a second vacuum pump and/or the first vacuum pump. Furthermore, in a small gas volume the pressure difference can be precisely adjusted and controlled with a piston processor or with a hydraulic plunger.

Between the etching bath and the first vacuum pump there can additionally be connected the volume reservoir which can have a large volume relative to the volume of the etching bath. As a result, the pressure drop in the etching bath can be additionally accelerated. Alternatively or in addition, compressed gas can be introduced into the etching bath by way of a ventilation side of the first vacuum pump to accelerate an increase in pressure, the etching bath in this case being of overpressure-resistant construction.

Prior to or during step C) the etching bath may be introduced into an ultrasonic bath. An ultrasonic radiation is then applied to the etching bath by the ultrasonic bath. The ultrasonic radiation enables the surface tension to be reduced, with the result that the adhesion of the gas bubbles to the walls of the separating trenches is reduced. As a result of the high frequencies of the ultrasonic radiation in the region of a few kHz, small amplitudes of the radiation can be used. It has been shown that a normally to be expected physical destruction of the surfaces of the layer sequence, of the carrier and/or of the growth substrate does not occur, but rather the movement of the etching solution in the separating trenches can be increased by ultrasonic radiation.

The etching bath may be heated to a process temperature using a heater. The process temperature may be at least 0 C, preferably at least 20 C and especially preferably at least 40 C, and at most the temperature at the thermodynamic critical point of the etching solution. An increase in the process temperature in particular allows an increase in the base pressure. Accordingly, a higher pressure variation can be generated in a simple manner because a higher base pressure allows a higher amplitude. In addition, as a result of the increased process temperature the chemical reaction of the etching solution with the sacrificial layer can be accelerated.

During steps B) to D) a wedge may be inserted between the growth substrate and the carrier. In particular, the wedge is inserted between the growth substrate and the layer sequence. A wedge is especially a body in which two side faces converge at an acute angle. Such a wedge serves especially as a feeler for the progress of the detachment process because the penetration depth of the wedge between the carrier and the growth substrate is increased as the etching process progresses. Furthermore, the wedge can be actively utilized to accelerate the detachment process by bending up the wafer composite. An additional stress between the growth substrate and the carrier, for example, as a result of a slight curvature of the growth substrate and/or the carrier, can further accelerate a detachment process.

It is also possible, using galvanic or electrochemical etching, to accelerate the chemical reaction between the etching solution and the sacrificial layer or to increase the selectivity of the etching process to the growth substrate and/or the carrier.

The method described herein is explained in greater detail below with reference to examples and associated Figures.

In the Figures, elements that are identical or similar or have identical action are denoted by the same reference numerals. The Figures and the relative sizes of the elements illustrated in the Figures to one another should not be regarded as to scale. Rather, the size of individual elements may have been exaggerated in the drawings for the purpose of better clarity and/or better understanding.

Figure 1A:
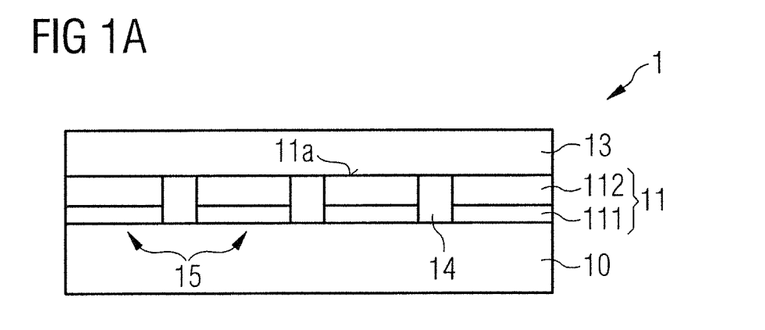
FIGS. 1A and 1B show examples of a wafer composite described herein for performing a method described herein.

An example of a wafer composite 1 described herein for performing a method described herein is explained in greater detail with reference to the diagrammatic sectional view of FIG. 1A. The wafer composite 1 comprises a growth substrate 10, to which a layer sequence 11 having a sacrificial layer 111 and a semiconductor layer stack 112 has been applied. The layer sequence 11 has a top surface 11a remote from the growth substrate 10. A carrier 13 has been applied to the top surface 11a. The carrier 13 can be, for example, a connection board and/or a circuit board. It is possible for the carrier 13 to comprise as material silicon, germanium, sapphire and/or some other, preferably crystalline, material which is not etched by the etching solution. Furthermore, the growth substrate 10 can comprise silicon, germanium, sapphire and/or the other material not etched by the etching solution or can consist of one of those materials.

The layer sequence 11 is patterned in a multiplicity of laterally spaced-apart regions 15. The regions are separated from one another by separating trenches 14. The separating trenches 14 pass completely through the layer sequence 11 in the vertical direction.

Figure 1B:
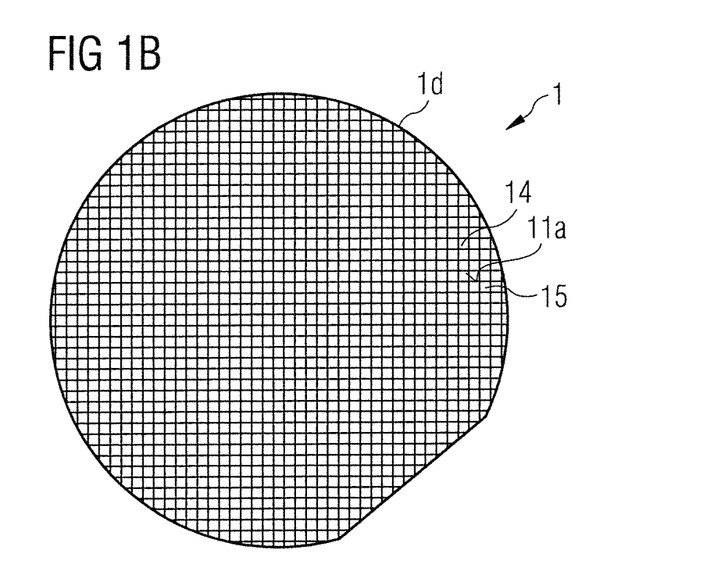

A further example of a wafer composite 1 described herein is explained in greater detail with reference to the diagrammatic plan view of FIG. 1B. The wafer composite 1 has a multiplicity of regions 15 separated from one another by the separating trenches 14. The separating trenches 14 encompass the regions 15 in a frame-like manner. In particular, the separating trenches 14 intercommunicate with/ and connect to an outer edge 1*d* of the wafer composite 1.

Figure 2:
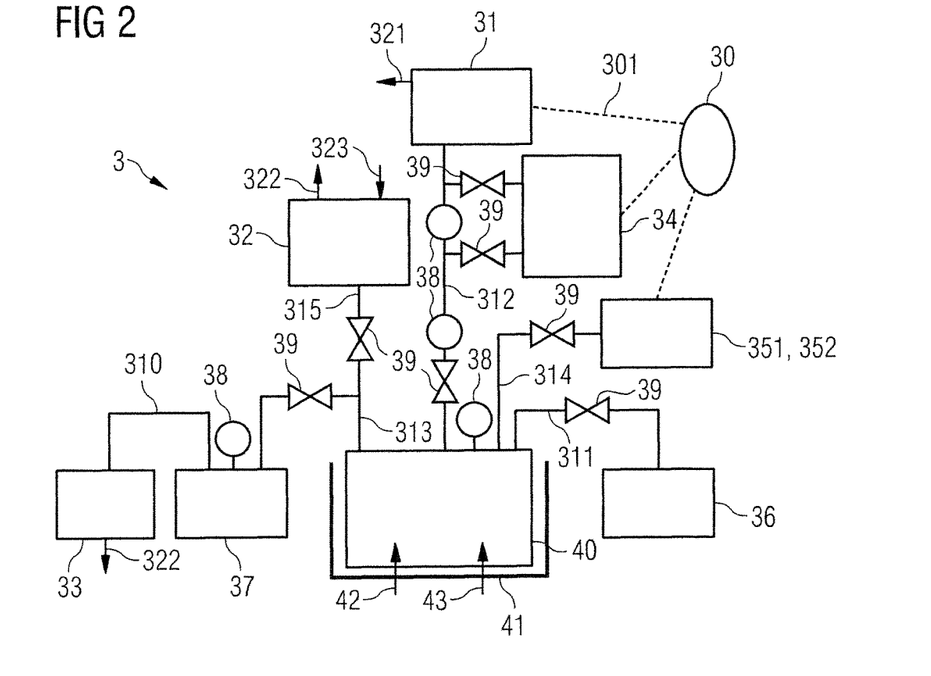
FIGS. 2 to 4, 5A, 5B and 6 show examples of a vacuum system for performing a method described herein.

An example of a vacuum system 3 for a method described herein is explained in greater detail with reference to the diagrammatic view of FIG. 2. The pressure variation device 3 comprises an etching bath 40. The etching bath 40 has in this case purely by way of example been introduced into an ultrasonic bath 41 with which an ultrasonic radiation 42 can be applied to the etching bath 40. Furthermore, the etching bath 40 can be heated to a process temperature with a heater 43.

The vacuum system 3 comprises a multiplicity of pressure gauges 38 and valves 39. The valves 39 can be shut-off valves, especially chemical-resistant shut-off valves. Furthermore, the vacuum system 3 comprises a multiplicity of vacuum connections 310, the function of which is explained in greater detail hereinbelow.

A chemical reservoir 36 connects to the etching bath 40 by way of a chemical feed inlet 311. By the chemical reservoir 36, in particular the etching solution 44 can be introduced into the etching bath 40.

A compressor 351 and/or a gas inlet 352 connects to the etching bath 40 by way of the overpressure line 314. By the overpressure line 314, an overpressure can be generated in the etching bath 40. For example, generation of the overpressure is effected by reducing the volume, especially a gas volume 45 (not shown in FIG. 2), within the etching bath 40 using the compressor 351. Alternatively or in addition, the pressure in the etching bath 40 can be increased with a gas inlet 352.

Furthermore, the etching bath 40 can connect by way of a vacuum line 312 to a vacuum reservoir 34 and/or to a first vacuum pump 31. The first vacuum pump 31 can be, for example, a chemical-resistant vacuum pump such as a scroll pump, a diaphragm pump or a water-jet pump. The first vacuum pump 31 can also have a cold trap preferably having a temperature below the freezing point of the etching solution. For example, the cold trap contains liquid nitrogen or dry ice. In addition, a discharge outlet 321 is attached to the first vacuum pump 31. By the discharge outlet 321, for example, reaction gases formed during the reaction of the etching solution 44 with the sacrificial layer 111 can be removed from the system.

The vacuum reservoir 34 can be, for example, an evacuated vessel that can connect by way of the valves 39 to the etching bath 40 to thus accelerate a pressure drop in the etching bath 40. In particular, there can be a vacuum in the vacuum reservoir 34, for example, with a pressure of at most 0.5 bar, preferably at most 0.05 bar.

The first vacuum pump 31, the vacuum reservoir 34, the compressor 351 and the gas inlet 352 connect to a pressure change controller 30 by way of control connections 301. The pressure change controller 30 is in particular programmable and serves for the deliberate adjustment of the pressure in the etching bath 40.

The vacuum system 3 also has a chemical outlet 313. A DI water feed inlet 315 connects to the chemical outlet 313. The DI water feed inlet 315 leads to a pump unit 32 that can be, for example, a water feed inlet or a water-jet pump. The pump unit 32 has an outflow 322 and an inflow 323. The DI water feed inlet 315 serves in particular for flushing the wafer composite 1 within the etching bath 40.

Furthermore, the etching bath 40 connects to a second vacuum pump 33 by way of the chemical outlet 313. The second vacuum pump 33 can likewise be a chemical-resistant vacuum pump such as, for example, a scroll pump, a diaphragm pump or a water-jet pump. The second vacuum pump 33 connects to the chemical outlet 313 by way of a Woulf's flask 37 having a pressure gauge 38. By way of the chemical outlet 313 the etching solution 44 can be removed from the etching bath 40. For that purpose, the second vacuum pump 33 likewise has an outflow 322.

The vacuum system 3 can additionally have a gas detector with which the reaction gases formed can be detected. As a result, the end of the process can be determined accordingly. For example, the reaction gases can be collected at a top side 40*a* of the etching bath 40. In particular, the top side 40*a* can have a funnel-like shape with a measuring cylinder having a readable scale being attached at the highest point. When the liquid level sinks, the amount of gas can be read off at the bottom of the meniscus of the scale.

Figure 3:
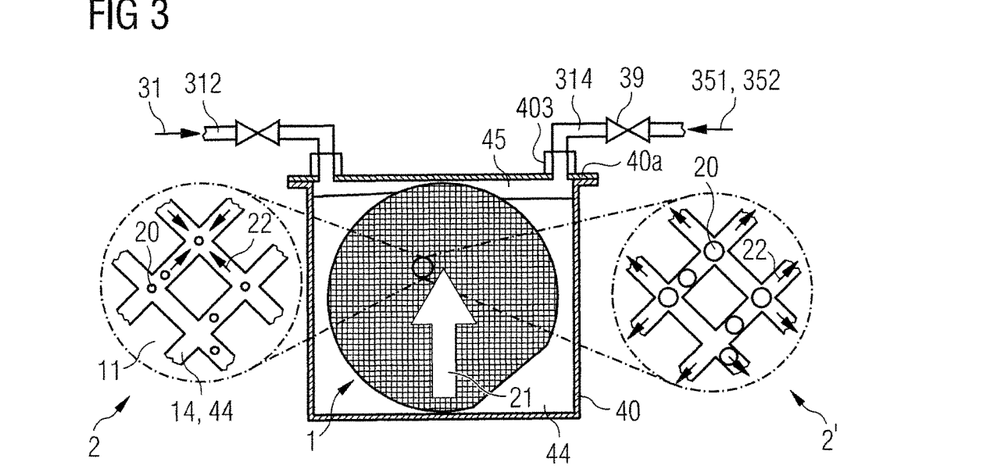

A further example of a vacuum system 3 for a method described herein of detaching a growth substrate 10 is explained in greater detail with reference to the diagrammatic view of FIG. 3. FIG. 3 shows a cross-section through the etching bath 40. At least one wafer composite 1 has been introduced into the etching bath 40. Furthermore, the etching bath 40 contains the etching solution 44 and a gas 45, which can be, for example, air. A liquid volume of the etching solution 44 and a gas volume of the gas 45 then together form a total volume of the etching bath 40. It is also possible, however, for the etching bath 40 to be completely full of the etching solution 44. The etching solution 44 can make up at least 80%, preferably at least 90% and especially preferably at least 95%, of the wafer composite 1.

At a top side 40*a* of the etching bath 40 there are two vacuum ports, with respective vacuum connections 310 being connected to the etching bath 40 by way of screw seals 403. In particular, the top side 40*a* of the etching bath 40 can have a lid.

On the left-hand side of the top side 40*a* of the etching bath 40 there is attached the vacuum line 312 that connects to the etching bath 40 by way of a valve 39. The first vacuum pump 31 (not shown in FIG. 3) is attached to the vacuum line 312. By way of the vacuum line 312, the pressure within the etching bath 40 can be reduced with the first vacuum pump 31.

On the right-hand side of the top side 40*a* of the etching bath 40 there is attached the overpressure line 314 that connects to the compressor 351 and/or to the gas inlet 352 (not shown in FIG. 3). By the compressor 351 or the gas inlet 352, the pressure within the etching bath 40 can be increased by way of the overpressure line 314.

Furthermore, FIG. 3 diagrammatically shows the effect of the pressure variation by the vacuum line 312 and the overpressure line 314. In particular, a preferred direction of movement 21 of the etching solution 44 in the wafer composite 1 is generated.

The two enlarged views 2, 2' of FIG. 3 in each case show a portion of the wafer composite 1 introduced into the etching bath 40. The wafer composite 1 contains the separating trenches 14, within which the etching solution 44 has been introduced. In addition, the separating trenches 14 have gas bubbles 20. For example, the gas bubbles 20 can have been generated by the chemical reaction of the etching solution 44 with the sacrificial layer 111 (not shown) of the layer sequence 11. The left-hand enlarged view 2 shows the gas bubbles 20 at a high pressure, especially the maximum pressure. The volume of the gas bubbles 20 is small at a high pressure. The right-hand enlarged view 2' shows the gas bubbles 20 at a lower pressure, especially the minimum pressure. As a result of the reduction in pressure, the volume of the gas bubbles 20 is increased and a convection 22 occurs. As a result of such convection 22, a movement of the gas bubbles 20 within the separating trenches is generated.

Figure 4:
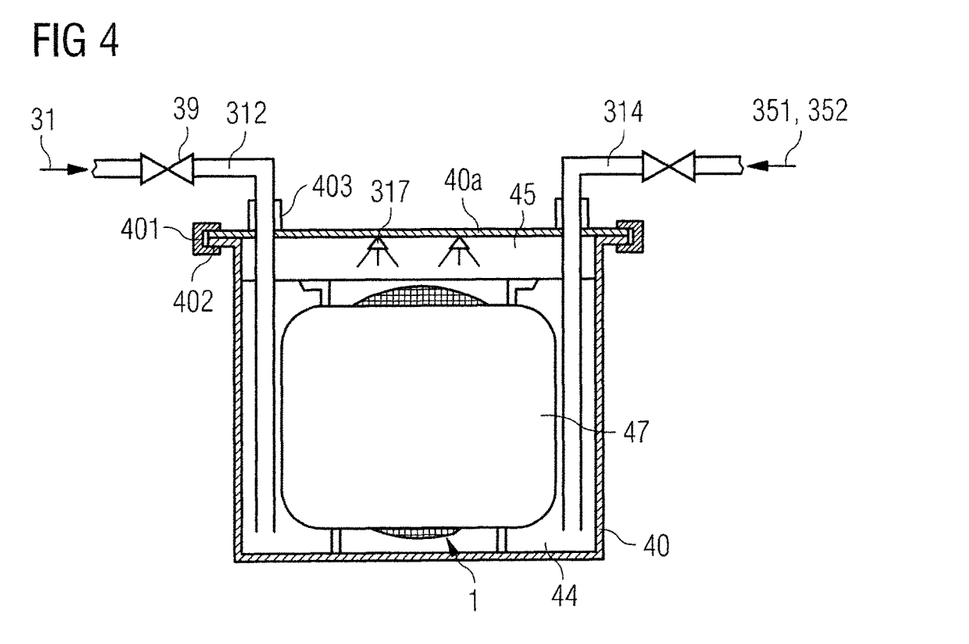

A further example of a vacuum system 3 used for a method described herein is explained in greater detail with reference to the diagrammatic views of FIG. 4. The example shown corresponds to that of FIG. 3, but further technical components are present as follows. A plurality of wafer composites 1, so-called racks, have been introduced into the etching bath 40 within the etching solution 44 by a wafer holder 47. Screw clips 401 and seals 402 are used to close the etching bath 40. Furthermore, within the etching bath 40 there is provided a water spray nozzle 317. The water spray nozzle 317 can connect, for example, to the DI water feed inlet 315 (not shown in FIG. 4). By the water spray nozzle 317, it is possible, for example, to clean and/or flush the wafer composite 1 after the method has been carried out so that any etching solution 44 possibly present on the wafer composite 1 is removed therefrom.

Figure 5A:
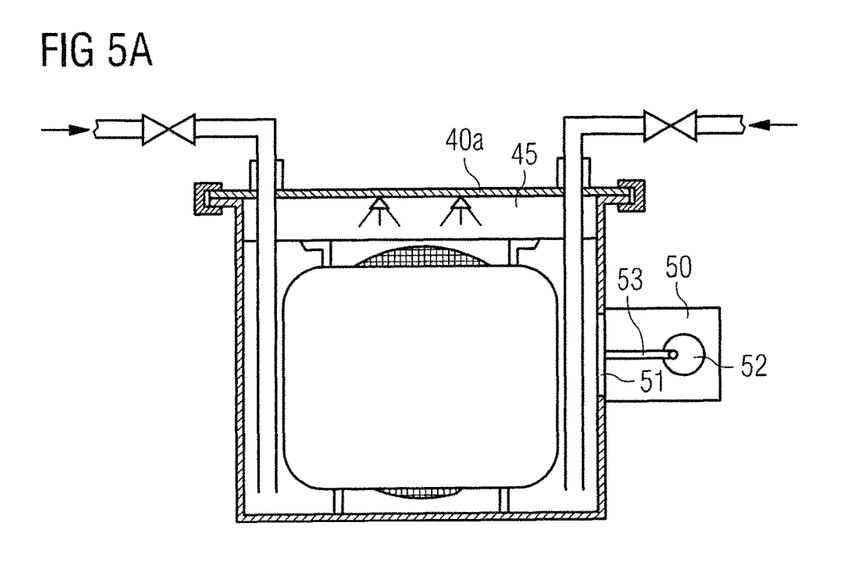

A further example of a vacuum system 3 for a method described herein is explained in greater detail with reference to the diagrammatic view of FIG. 5A. Unlike the vacuum system 3 of FIG. 4, the vacuum system 3 of FIG. 5A additionally comprises a buffer chamber 50 laterally attached to the etching bath 40. In the example of FIG. 5A, the volume of the buffer chamber 50 is coupled directly to the etching solution 44, that is to say to the liquid volume. The buffer chamber 50 is in this case a cylindrical chamber having in its interior a hydraulic plunger 51 or a piston 51. By a pivot joint 52 and a pivot arm 53, the piston 51 or the hydraulic plunger 51 can be moved such that a swept volume of the buffer chamber 50 can be added to the volume of the etching bath 40 or removed therefrom. As a result, it is possible to vary the volume within the etching bath 40 and accordingly generate a pressure variation within the etching bath 40. The buffer chamber 50 can have additional variation valves (not shown in FIG. 5A) that can be controlled individually to thus generate, as desired, overpressure or underpressure in the etching bath 40.

Figure 5B:
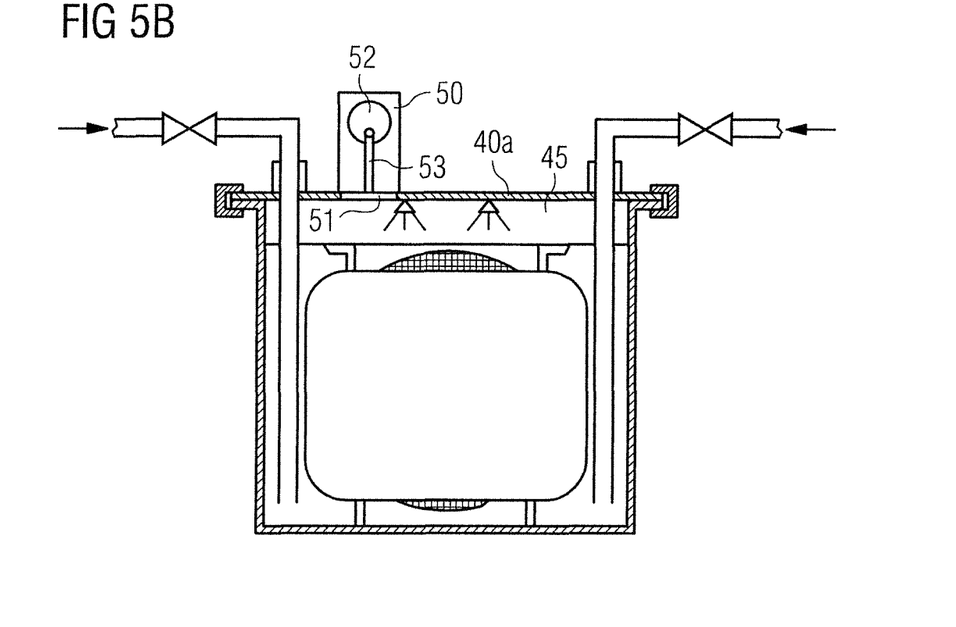

A further example of a vacuum system 3 for a method described herein is explained in greater detail with reference to the diagrammatic view of FIG. 5B. Unlike the vacuum system 3 of FIG. 5A, the buffer chamber 50 is attached to the top side 40a of the etching bath 40 and accordingly is in contact with the gas 45. In the example shown, the buffer chamber 50 is therefore coupled to the gas volume of the gas 45.

It is also possible (not shown in the Figures) for the buffer chamber 50 to be attached to the etching bath 40 such that the volume of the buffer chamber 50 simultaneously contacts the gas 45 and the etching solution 44.

Figure 6:
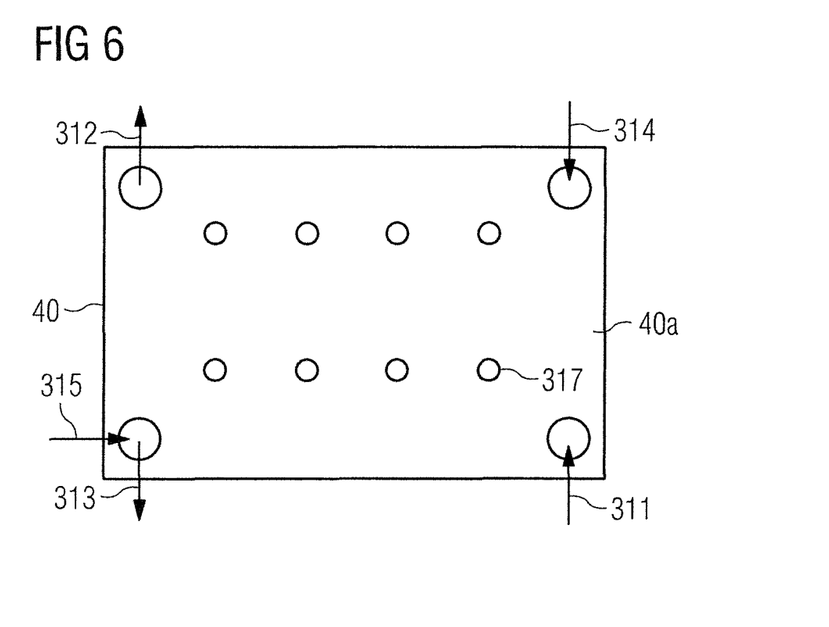

A further example of a vacuum system 3 of performing a method described herein is explained in greater detail with reference to the diagrammatic plan view of FIG. 6. A plan view onto the etching bath 40 is shown. This Figure shows the ports for the water spray nozzle 317, and also the ports for the chemical feed inlet 311, the vacuum line 312, the chemical outlet 313, the overpressure line 314 and the DI water feed inlet 315.

Unlike an alternative method in which movement of the etching solution is increased by an externally applied pressure gradient and not by a pressure variation, in this method the wafer composite 1 is not sealed. Accordingly, instead of providing each wafer composite with vacuum seals, in this case processing can simply be carried out on the rack scale and is accordingly suitable for mass production.

This application claims priority of DE 10 2015 104 147.2, the subject matter of which is incorporated herein by reference.

The description of our methods with reference to the examples does not limit this disclosure thereto. Rather, this disclosure encompasses any novel feature and any combination of features, including in particular any combination of features in the appended claims, even if the feature or combination is not itself explicitly defined in the claims or examples.

The invention claimed is:

1. A method of detaching a growth substrate from a layer sequence comprising:
    A) providing at least one wafer composite comprising the growth substrate, the layer sequence applied to the growth substrate, and a carrier attached to a top surface of the layer sequence remote from the growth substrate, wherein
       the layer sequence is patterned in a multiplicity of regions spaced apart in lateral directions and separated from one another by a multiplicity of separating trenches, and
       the separating trenches connect to one another,
    B) introducing the at least one wafer composite into an etching bath containing an etching solution such that the etching solution is located at least in regions within the separating trenches,
    C) repeatedly varying a pressure of a base pressure prevailing in the etching bath with at least one pressure variation device, and
    D) detaching the growth substrate,
   wherein at least one of 1)-3) is satisfied:
    1) prior to B) a buffer chamber attached to the etching bath and connected thereto is provided and a volume variation is effected by a movement of a piston or hydraulic plunger introduced into the buffer chamber,
    2) the volume variation is at least partly effected with a compressor attached to the etching bath, and
    3) the pressure variation is at least partly effected by at least one of removal of a gas and a liquid from the etching bath or by addition of at least one of the gas and the liquid thereto, the removal is effected with a first vacuum pump connected to the etching bath and the addition is effected with a gas inlet connected to the etching bath.

2. The method according to claim 1, wherein at least the etching solution located within the separating trenches has gas bubbles, the pressure variation giving rise to an alteration in the volume of the gas bubbles and, accordingly, in a convection of the etching solution within the separating trenches.

3. The method according to claim 1, wherein the pressure variation comprises a temporal change between a maximum pressure, corresponding to at least 2 times the base pressure, and a minimum pressure corresponding to at most 0.2 times the base pressure.

4. The method according to claim 1, wherein the pressure variation takes place temporally periodically at a variation frequency of at least 0.01 Hz and at most 15 kHz.

5. The method according to claim 1, wherein the pressure variation includes a volume variation between a minimum volume and a maximum volume around a base volume of the etching bath, the maximum volume corresponding to at least 3 times and the minimum volume corresponding to at most 0.5 times the base volume.

6. The method according to claim 1, wherein the removal is effected with a first vacuum pump connected to the etching bath and the addition is effected with a gas inlet connected to the etching bath.

7. The method according to claim 1, wherein prior to or during C), the etching bath is introduced into an ultrasonic bath, and an ultrasonic radiation is applied to the etching bath.

8. The method according to claim 1, wherein the etching bath is heated using a heater to a process temperature which is at least 80° C. and at most the temperature at the thermodynamic critical point of the etching solution.

9. The method according to claim 1, wherein during steps B) to D) a wedge is inserted between the growth substrate and the carrier.

\* \* \* \* \*